United States Patent [19]
Gao et al.

[11] Patent Number: 5,786,306
[45] Date of Patent: Jul. 28, 1998

[54] SYNTHESIS OF HIGH $T_C$ SUPERCONDUCTING COATINGS AND PATTERNS BY MELT WRITING AND OXIDATION OF METALLIC PRECURSOR ALLOYS

[75] Inventors: Wei Gao, Somerville; John B. Vander Sande, Newbury, both of Mass.

[73] Assignee: Massachusetts Institute of Technology, Cambridge, Mass.

[21] Appl. No.: 696,973

[22] Filed: May 1, 1991

Related U.S. Application Data

[63] Continuation of Ser. No. 542,170, Jun. 22, 1990, abandoned.

[51] Int. Cl.[6] .................................................. H01L 39/24
[52] U.S. Cl. ................. 505/452; 29/599; 427/63; 427/96; 427/256; 427/287; 505/471; 505/818
[58] Field of Search .......................... 29/599, 846, 850; 505/1, 220, 450, 452, 470, 233, 234, 235, 236, 237, 238, 434, 471, 701, 818; 222/590, 593; 427/96, 256, 286, 287, 63

[56] References Cited

U.S. PATENT DOCUMENTS

| | | | |
|---|---|---|---|
| 3,374,110 | 3/1968 | Miller | 427/96 X |
| 4,049,844 | 9/1977 | Bolon et al. | 427/96 X |
| 4,656,048 | 4/1987 | Kudoh et al. | 427/96 X |
| 4,697,335 | 10/1987 | Pedersen et al. | 29/846 X |
| 4,754,900 | 7/1988 | MacKay | 222/590 |
| 4,820,688 | 4/1989 | Jasper, Jr. | 505/1 X |
| 4,826,808 | 5/1989 | Yurek et al. | |
| 4,960,752 | 10/1990 | Ashok et al. | 505/1 |
| 4,970,197 | 11/1990 | Shiota et al. | 29/599 X |
| 5,075,286 | 12/1991 | Powell et al. | 505/450 X |

FOREIGN PATENT DOCUMENTS

| | | |
|---|---|---|
| 63-279521 | 11/1988 | Japan . |
| 63-279527 | 11/1988 | Japan . |
| 6489218 | 4/1989 | Japan . |
| 1286920 | 11/1989 | Japan . |

*Primary Examiner*—Joseph M. Gorski
*Attorney, Agent, or Firm*—Choate, Hall & Stewart

[57] ABSTRACT

A method is provided for fabrication of superconducting oxides and superconducting oxide composites and for joining superconductors to other materials. A coating of a molten alloy containing the metallic elements of the oxide is applied to a substrate surface and oxidized to form the superconducting oxide. A material can be contacted to the molten alloy which is subsequently oxidized joining the material to the resulting superconducting oxide coating. Substrates of varied composition and shape can be coated or joined by this method.

53 Claims, 2 Drawing Sheets

SYNTHESIS OF HIGH $T_C$ SUPERCONDUCTING COATINGS AND PATTERNS BY MELT WRITING AND OXIDATION OF METALLIC PRECURSOR ALLOYS

This is a continuation of application Ser. No. 07/542,170 filed on Jun. 22, 1990 and now abandoned.

The United States Government has rights to this invention based upon funding by the Department of Energy Grant Number DE-FG02-8SER-45179

BACKGROUND OF THE INVENTION

This invention relates to superconducting materials.

Superconductors are materials having essentially zero resistance to the flow of current below a certain critical temperature, $T_c$. It is known that certain metal oxides, e.g., $La_{2-x}Ba_xCuO_{4-y}$, $La_{2-x}Sr_xCuO_{4-y}$, $Ba_2YCu_3O_{9-y}$, etc. exhibit superconductivity. It is desirable to produce coatings of superconducting oxides on substrates selected to optimize properties needed for particular applications. Sputtering, metal organic deposition, and plasma spraying are established techniques for production of superconducting coatings.

SUMMARY OF THE INVENTION

The invention provides a method for preparing a superconducting oxide coating by combining metallic elements of the oxide to form an alloy, melting the alloy, applying the molten alloy to a substrate surface, and oxidizing the alloy to form the superconducting oxide.

The invention also provides a method of forming a superconducting oxide coating and joining superconducting material to another material by combining metallic elements of the oxide to form an alloy, melting the alloy, applying the molten alloy to a first substrate, contacting a second substrate to this molten alloy, and oxidizing the alloy to form the superconducting alloy resulting in the joining of the two substrates.

The molten alloy can be melted in a tube and applied through a nozzle to the substrate with or without pressure as the nozzle and substrate are displaced relative to one another.

This coating method is readily extended to use with substrates of varying geometries, including plates, sheets, ribbons, tubes, wires, or coils. Long substrates can be coated in a continuous process. Substrates can be metals, including noble metals, such as silver, gold, palladium or platinum, or nickel, or stainless steels, or monolithic ceramics such as strontium titanate, barium zirconate, magnesium oxide, aluminum oxide or composite materials. Substrates can be selected to lattice match the resulting superconducting oxide. Lattice-matched substrates enable epitaxial superconductor coating growth resulting in highly textured coatings capable of sustaining high critical current densities.

Substrate identity and other processing parameters can be optimized to promote formation of superconducting phases, enhance texturing in the superconducting phases, and/or improve the mechanical properties of the resulting superconducting coating/substrate composite. Adhesion between the substrate and superconductor coating can be improved by substrate selection and substrate pretreatment.

The thickness and width of the superconductor oxide coating can be controlled by selectively varying process parameters so that "writing" of a superconductor oxide coating pattern is possible. Process parameters include the identity of the precursor alloy and substrate, substrate surface finish, molten alloy and substrate temperature, nozzle size and shape, nozzle and substrate relative displacement, nozzle and substrate speed, and the pressure under which the molten precursor alloy is ejected from the nozzle. "Writing" of a superconductor oxide coating pattern is accomplished by moving the nozzle and/or work piece in a controlled atmosphere resulting in deposition of coatings 0.5–500 μm and typically 50 μm thick. Further, post-deposition annealing steps can be carried out. The alloy can contain base metallic elements including La, Yb, Y, Ba, Ca, Cu, Bi, Pb, Sr, Tl and other rare earth elements such as Ce, Nd, Pm, Sm, Eu, Gd, Dy, Ho, Er, Tm and Lu and noble metallic elements including Ag, Au, Pd and Pt. More specifically, the alloy can contain metallic elements La, Ba and Cu; La, Sr and Cu; Lu, Ba and Cu; Lu, Sr and Cu; Yb, Ba and Cu; Er, Ba and Cu; Nb, Ba and Cu; Pm, Ba and Cu; Sm, Ba and Cu; Eu, Ba and Cu; Gd, Ba and Cu; Dy, Ba and Cu; Nd, Ce and Cu; Yb, Ba, Sr and Cu; Y, Ba, Cu and Ag; Yb, Ba, Ca and Cu; Y, Yb, Ba and Cu; Bi, Sr, Ca and Cu; Bi, Pb, Sr, Ca and Cu; Bi, Pb, Sn, Sr, Ca and Cu; Bi, Pb, Sr, La and Cu; Bi, Pb, Sr, Y, and Cu; Bi, Sr, Y, Ca and Cu; Pb, Sr, Nd, Ce and Cu; Pb, Sr, Pr, Ce and Cu; Pb, Sr, La, Ce and Cu; Pb, Sr, Y, Ca and Cu; Tl, Ba and Cu; Tl, Ca, Ba and Cu; Tl, Pb, Ca, Ba and Cu; with or without noble metallic elements Ag, Au, Pd or Pt.

The melt writing coating technique of the invention provides a very flexible method for production of superconducting composites for different applications. The technique can be used for production of superconducting composites on long, continuous substrates possessing mechanical, crystallographic and chemical properties carefully chosen to meet the needs of a particular application. Furthermore, the technique can be used to join superconductor material to other materials including superconductors, metals, and ceramics.

DESCRIPTION OF THE PREFERRED EMBODIMENT

Figure 1:
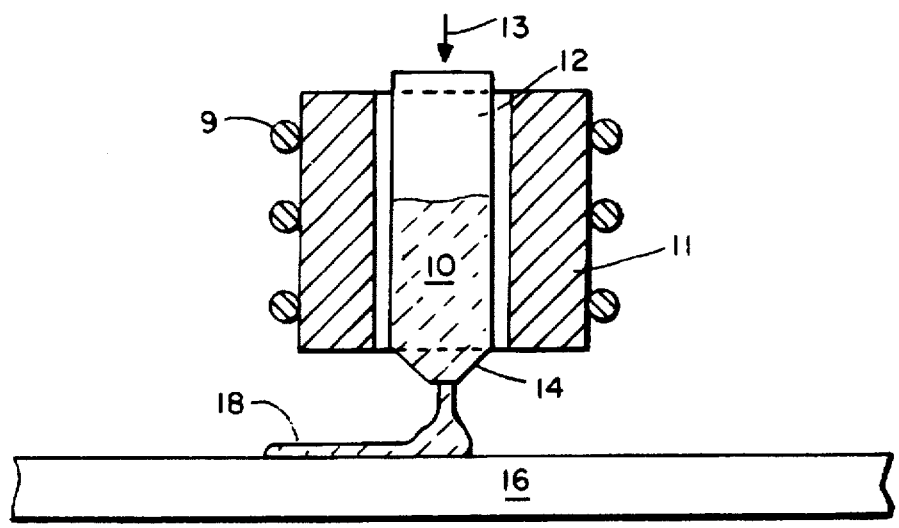
FIG. 1 is a schematic representation of an apparatus for carrying out the invention.

In a preferred embodiment, a high $T_c$ superconducting coating is prepared by melt writing and oxidation of a metallic precursor alloy containing the metallic constituents of the superconducting oxide, as shown in FIG. 1. Molten alloy 10 contained within induction coil 9, graphite cylinder 11, and tube 12 is forced under pressure as indicated by arrow 13 through nozzle 14 onto long, continuous substrate 16 to form metallic precursor alloy coating 18. The resulting coating with substrate is subsequently oxidized to form the superconducting oxide coating.

Substrate 16 can be a metal including noble metals such as silver which enhances the mechanical properties of the resulting composite. Alternatively, substrate 16 can be a ceramic such as strontium titanate which is lattice matched with yttrium barium copper oxide resulting in epitaxial growth of a highly textured film or barium zirconate which is highly chemically stable with respect to yttrium barium copper oxide. Further, a bismuth strontium calcium copper oxide coating can be applied to a magnesium oxide or silver substrate. Substrate 16 can be a plate, sheet, ribbon, tube surface, coil, etc.

Figure 2:
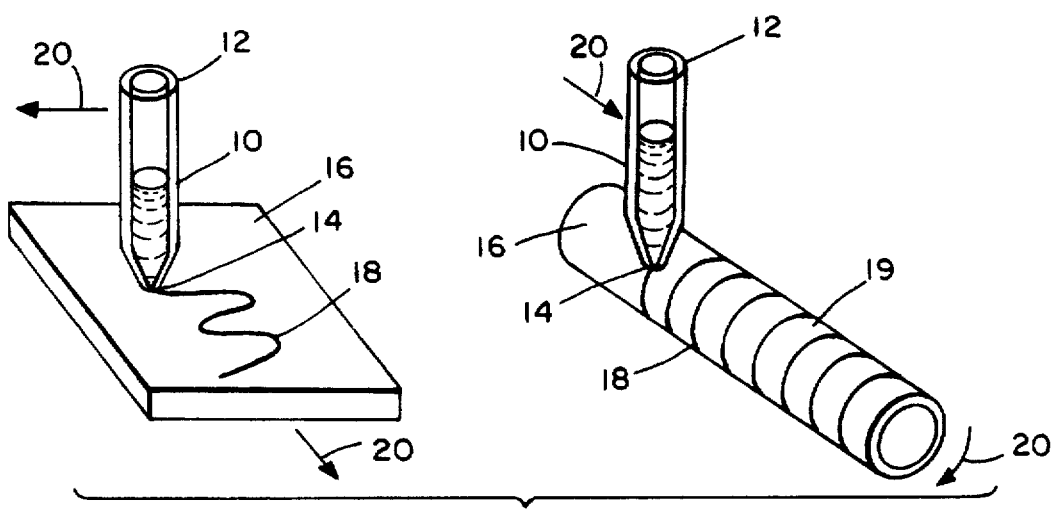
FIG. 2 is a schematic representation of melt writing on substrates of different geometries.

FIG. 2 illustrates writing of a superconductor oxide coating on flat substrate 16 or cylindrical substrate 19. Arrows 20 indicate the directions of motion of substrates 16 and 19 to enable the writing of particular precursor alloy coating patterns 18.

Figure 3:
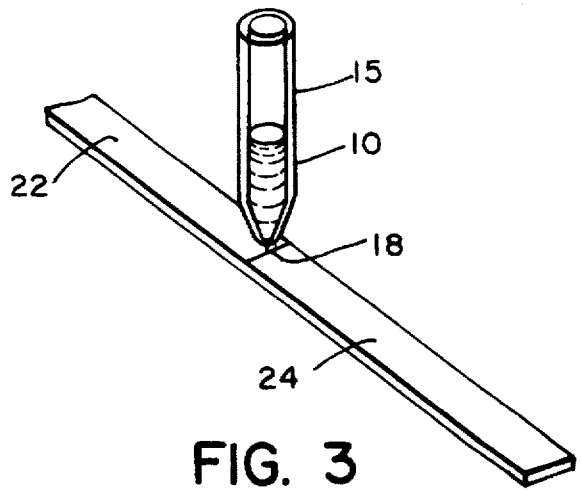
FIG. 3 is a schematic representation of using the method of the invention for joining two superconductors together.
Figure 4:
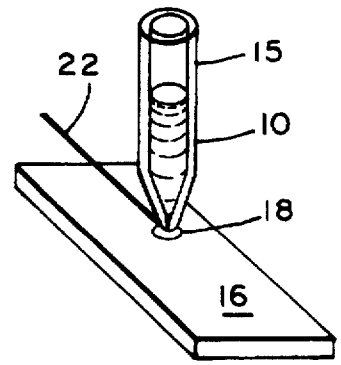
FIG. 4 is a schematic representation of using the method of the invention for joining a superconductor with a metal substrate.

Two superconducting ribbons 22 and 24 can be joined by forming a precursor alloy joint of molten precursor alloy 10 contained in nozzle 15 as shown in FIG. 3. Alternatively, superconducting ribbon 22 can be joined to metal substrate 16 which can be a noble metal such as silver, by forming a joint 18 of molten precursor alloy 10 from nozzle 15 as shown in FIG. 4.

EXAMPLE 1

A bismuth lead strontium calcium copper oxide-silver superconducting coating can be applied to a long silver ribbon according to the invention. A precursor alloy containing Bi—Pb—Sr—Ca—Cu—Ag was melted in a crucible by induction melting under a controlled, protective atmosphere and ejected onto a long 0.4 mm wide, long silver ribbon. The adherent precursor alloy coatings were 0.20–0.25 mm wide and 50–70 μm thick. The precursor alloy coating/silver substrate composites were then oxidized and annealed under suitable conditions to obtain a superconducting zero-resistance transition temperature of 106K and desirable transport properties, including critical current densities of approximately 1000 $A/cm^2$ at 77K.

Figure 5:
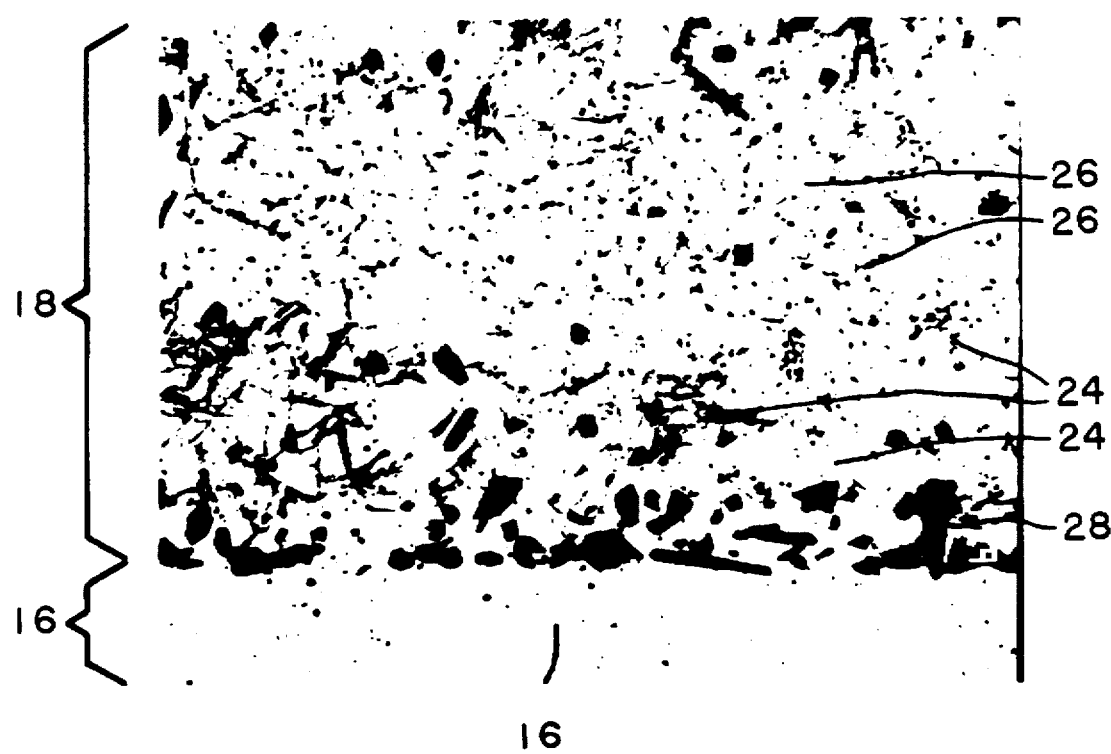
FIG. 5 is a cross section scanning electron micrograph (back-scattered electron image) for a superconducting Bi—Pb—Sr—Ca—Cu—O/Ag microcomposite coating on a silver substrate produced according to the invention magnified 860 times.

A typical microstructure of such a coating is shown in FIG. 5, a cross section scanning electron micrograph of superconducting bismuth strontium calcium copper oxide-silver microcomposite coating 18 on silver substrate 16 prepared according to the invention. Superconducting microcomposite 18 contains regions of "2223" superconducting phase 24, silver 26, and calcium copper oxide 28.

What is claimed is:

1. A method for preparing an adherent superconducting oxide coating comprising:

combining metallic elements of a superconducting oxide to form an alloy;

melting said alloy and maintaining said alloy in a molten state;

melt writing with said molten alloy such that said molten alloy is applied through an orifice to a surface of a substrate;

selectively varying process parameters so that the thickness and width of said molten alloy can be controlled;

moving said orifice and substrate with respect to one another so as to form a patterned precursor alloy; and oxidizing said patterned alloy to form said adherent superconducting oxide.

2. The method of claim 1 wherein said substrate is a metal, ceramic or superconductor.

3. The method of claim 2 wherein said metal is a metal chosen from the group consisting of silver, gold, palladium, platinum, nickel, and stainless steels.

4. The method of claim 2 wherein said metal is a composite material.

5. The method of claim 2 wherein said ceramic is a ceramic chosen from the group consisting of strontium titanate, barium zirconate, magnesium oxide and aluminum oxide.

6. The method of claim 1 wherein said alloy is melted in a tube and applied to said substrate through a nozzle.

7. The method of claim 1 wherein said alloy is forced through said nozzle under pressure.

8. The method of claim 1 wherein said alloy is delivered through said nozzle without applied pressure.

9. The method of claim 1 wherein said substrate includes a plate, sheet, ribbon, tube, wire, or coil geometry.

10. The method of claim 1 wherein said substrate is long and continuous.

11. The method of claim 1 wherein said substrate is lattice matched to said superconducting oxide.

12. The method of claim 11 wherein said superconducting oxide grows epitaxially on said substrate.

13. The method of claim 1 wherein said substrate enhances texturing in the superconducting coating.

14. The method of claim 1 wherein said substrate promotes formation of superconducting phases.

15. The method of claim 1 wherein said substrate improves the mechanical properties of the superconducting coating.

16. The method of claim 1 wherein said substrate ensures good adhesion between the superconducting oxide coating and substrate.

17. The method of claim 1 wherein a surface treatment is applied to said substrate to promote superconducting oxide coating adhesion.

18. The method of claim 1 wherein the thickness of the resulting superconducting oxide coating is controlled by selecting precursor alloy, substrate, substrate surface finish, molten alloy temperature, substrate temperature, nozzle size and shape, nozzle and substrate relative displacement, nozzle speed, substrate speed and molten alloy ejection pressure.

19. The method of claim 1 wherein width of the resulting superconducting oxide coating can be controlled by selecting precursor alloy, substrate, substrate surface finish, molten alloy temperature, substrate temperature, nozzle size and shape, nozzle and substrate displacement, nozzle speed, substrate speed and molten alloy ejection pressure.

20. The method of claim 1 wherein said superconducting oxide coating is deposited on said substrate in a pattern.

21. The method of claim 1 further comprising a post-deposition oxidation and annealing step.

22. The method of claim 1 wherein said metallic elements are chosen from the group consisting of La, Ba, Cu, Ca, Y, Sr, Yb, Bi, Pb, Tl, Ce, Nd, Pm, Sm, Eu, Gd, Dy, Ho, Er, Tm, Lu, Ag, Au, Pd and Pt.

23. The method of claim 1 wherein said metallic elements comprise La, Ba, and Cu.

24. The method of claim 1 wherein said metallic elements comprise La, Sr, and Cu.

25. The method of claim 1 wherein said metallic elements comprise Y, Ba, and Cu.

26. The method of claim 1 wherein said metallic elements comprise Lu, Ba, and Cu.

27. The method of claim 1 wherein said metallic elements comprise Lu, Sr, and Cu.

28. The method of claim 1 wherein said metallic elements comprise Yb, Ba and Cu.

29. The method of claim 1 wherein said metallic elements comprise Er, Ba and Cu.

30. The method of claim 1 wherein said metallic elements comprise Nb, Ba and Cu.

31. The method of claim 1 wherein said metallic elements comprise Pm, Ba and Cu.

32. The method of claim 1 wherein said metallic elements comprise Sm, Ba and Cu.

33. The method of claim 1 wherein said metallic elements comprise Eu, Ba and Cu.

34. The method of claim 1 wherein said metallic elements comprise Gd, Ba and Cu.

35. The method of claim 1 wherein said metallic elements comprise Dy, Ba and Cu.

36. The method of claim 1 wherein said metallic elements comprise Nd, Ce and Cu.

37. The method of claim 1 wherein said metallic elements comprise Yb, Ba, Sr and Cu.

38. The method of claim 1 wherein said metallic elements comprise Y, Ba, Cu and Ag.

39. The method of claim 1 wherein said metallic elements comprise Yb, Ba, Ca and Cu.

40. The method of claim 1 wherein said metallic elements comprise Y, Yb, Ba and Cu.

41. The method of claim 1 wherein said metallic elements comprise Bi, Sr, Ca and Cu.

42. The method of claim 1 wherein said metallic elements comprise Bi, Pb, Sr, Ca and Cu.

43. The method of claim 1 wherein said metallic elements comprise Bi, Pb, Sn, Sr, Ca and Cu.

44. The method of claim 1 wherein said metallic elements comprise Bi, Pb, Sr, La and Cu.

45. The method of claim 1 wherein said metallic elements comprise Bi, Pb, Sr, Y and Cu.

46. The method of claim 1 wherein said metallic elements comprise Bi Sr, Y, Ca and Cu.

47. The method of claim 1 wherein said metallic elements comprise Pb, Sr, Nd, Ce and Cu.

48. The method of claim 1 wherein said metallic elements comprise Pb, Sr, Pr, Ce and Cu.

49. The method of claim 1 wherein said metallic elements comprise Pb, Sr, La, Ce and Cu.

50. The method of claim 1 wherein said metallic elements comprise Pb, Sr, Y, Ca and Cu.

51. The method of claim 1 wherein said metallic elements comprise Tl, Ba and Cu.

52. The method of claim 1 wherein said metallic elements comprise Tl, Ca, Ba and Cu.

53. The method of claim 1 wherein said metallic elements comprise Tl, Pb, Ca, Ba and Cu.

* * * * *